United States Patent
Knight

(10) Patent No.: US 10,297,532 B2
(45) Date of Patent: May 21, 2019

(54) STACKED INTERCONNECT STRUCTURE AND METHOD OF MAKING THE SAME

(71) Applicant: Thomas J. Knight, Silver Springs, MD (US)

(72) Inventor: Thomas J. Knight, Silver Springs, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 413 days.

(21) Appl. No.: 15/186,175

(22) Filed: Jun. 17, 2016

(65) Prior Publication Data

US 2016/0293520 A1 Oct. 6, 2016

Related U.S. Application Data

(62) Division of application No. 14/198,281, filed on Mar. 5, 2014, now Pat. No. 9,385,068.

(51) Int. Cl.
| | |
|---|---|
| *H01L 21/768* | (2006.01) |
| *H01L 23/48* | (2006.01) |
| *H01L 21/764* | (2006.01) |
| *H01L 23/482* | (2006.01) |
| *H01L 23/522* | (2006.01) |
| *H01L 23/528* | (2006.01) |
| *H01L 23/532* | (2006.01) |

(52) U.S. Cl.
CPC ........ *H01L 23/4821* (2013.01); *H01L 21/764* (2013.01); *H01L 21/7682* (2013.01); *H01L 21/7688* (2013.01); *H01L 21/76883* (2013.01); *H01L 23/481* (2013.01); *H01L 23/5222* (2013.01); *H01L 23/5226* (2013.01); *H01L 23/5283* (2013.01); *H01L 23/53223* (2013.01); *H01L 23/53238* (2013.01); *H01L 23/53252* (2013.01); *H01L 23/53295* (2013.01); *H01L 2924/0002* (2013.01)

(58) Field of Classification Search
CPC .................................. H01L 2221/1042–1047
See application file for complete search history.

(56) References Cited

U.S. PATENT DOCUMENTS

| | | |
|---|---|---|
| 5,461,003 A | 10/1995 | Havemann et al. |
| 5,559,055 A | 9/1996 | Chang et al. |

(Continued)

*Primary Examiner* — Shaun M Campbell
*Assistant Examiner* — Aneta B Cieslewicz
(74) *Attorney, Agent, or Firm* — Tarolli, Sundheim, Covell & Tummino LLP

(57) ABSTRACT

A stacked interconnect structure includes a first conductive layer, a second conductive layer, and a first dielectric layer disposed between the first and second conductive layers and having an air gap in a portion of the first dielectric layer that separates the first and second conductive layers. A second dielectric layer is parallel to the first conductive layer, a third dielectric layer overlays a portion of the second dielectric layer and contacts two opposing surfaces of the second conductive layer. A first via extends into the air gap of the first dielectric layer, wherein the second conductive layer is separated from the first via by a portion of the third dielectric layer that extends from a given surface of the third dielectric layer to the second dielectric layer, and a second via that extends from the given surface of the third dielectric layer to the second conductive layer.

14 Claims, 6 Drawing Sheets

(56) References Cited

U.S. PATENT DOCUMENTS

| | | |
|---|---|---|
| 6,165,890 A | 12/2000 | Kohl et al. |
| 6,423,630 B1 | 7/2002 | Catabay et al. |
| 6,881,668 B2 | 4/2005 | Lee et al. |
| 7,361,991 B2 | 4/2008 | Saenger et al. |
| 2005/0245063 A1* | 11/2005 | Chinthakindi ...... H01L 21/7682 438/618 |
| 2005/0263896 A1 | 12/2005 | Lur et al. |
| 2007/0264819 A1 | 11/2007 | Offenberg et al. |
| 2009/0267192 A1* | 10/2009 | Anderson ......... H01L 21/31053 257/618 |
| 2011/0316101 A1* | 12/2011 | Dang .................. B81C 1/00365 257/418 |
| 2012/0052674 A1 | 3/2012 | Lee et al. |
| 2014/0264475 A1* | 9/2014 | Lin .................. H01L 21/02175 257/254 |

* cited by examiner

STACKED INTERCONNECT STRUCTURE AND METHOD OF MAKING THE SAME

RELATED APPLICATIONS

This application is a divisional of U.S. patent application Ser. No. 14/198,281, filed 5 Mar. 2014, which is incorporated herein in its entirety.

TECHNICAL FIELD

The present invention relates generally to electronics, and more particularly to a stacked interconnect structure and method of making the same.

BACKGROUND

Commercial silicon complementary metal oxide semiconductor (CMOS) technology nodes require aggressive techniques in order to address the demands of shrinking technology geometries. Of particular concern in this work is the RC time delay, whose value needs to be kept low in order to maintain signal integrity. Scaling technology nodes tend to increase RC values, though, as metal lines shrink and therefore push resistance, R, higher and thinning inter-metal dielectric layers tend to increase capacitance, C. To some extent, these affects are mitigated by improved materials, such as transition to lower dielectric-constant insulators. State-of-the-art materials can be porous such as silicon carbide hydroxide (SiCOH) and copper metal lines. However, next-generation material selections are unresolved and even the most aggressive material cannot supplant air at the material of choice for low capacitance.

Increasingly aggressive RC time delay targets for back end of line (BEOL) interconnects have forced low effective dielectric constant technologies to struggle to keep pace with the needs of smaller technology nodes. In particular, ultra-low k porous SiCOH provides a dielectric constant of 2.4. However, even this is insufficient to support upcoming technologies and so some attempts at air gap technology have been established. These air gaps help isolated metal lines from adjacent ones, lowering the effective permittivity. However, still further reduction in RC is needed to keep pace with the International Technology Roadmap for Semiconductors (ITRS) and track Moore's law. Conducting lines will actually increase resistance as they shrink in size particularly as less conductive liner layers begin to dominate the resistive losses as compared to the copper. This will further exacerbate the RC performance dilemma.

SUMMARY

In accordance with an example, a method is provided of forming an interconnect structure. The method comprises forming a first dielectric layer overlying a first conductive layer, etching a trench opening in the first dielectric layer, depositing a sacrificial material layer in the trench opening, and forming a second conductive layer overly the sacrificial layer. The method also comprises forming a via to the sacrificial material layer, and performing an etch to remove the sacrificial material layer through the via and leave a resultant air gap between the first conductive layer and the second conductive layer increasing the effective dielectric constant between the first and second conductive layers.

In accordance with another example, a method is provided of forming an interconnect structure. The method comprises forming a first dielectric layer overlying a first conductive layer, etching a trench opening in the first dielectric layer, depositing a sacrificial material layer in the trench opening, and forming a second conductive layer overlying the sacrificial layer. The method further comprises forming an etch stop layer over the second conductive layer, etching away portions of the etch stop layer and the second conductive layer to provide a second conductive portion that over the first conductive layer, an etch stop that overlies the second conductive portion, and forming a third dielectric layer overlying the etch stop layer and the sacrificial layer. An etch is performed to concurrently to form a first via to the sacrificial layer and a second via to the etch stop of the second conductive portion. An etch is also performed to remove the sacrificial material layer through the first via and leave a resultant air gap between the first conductive layer and the second conductive portion increasing the effective dielectric constant between the first conductive layer and the second conductive portion.

In accordance with one example, an interconnect structure is provided that comprises a first conductive layer, a second conductive layer, and a dielectric layer disposed between the first and second conductive layers and having an air gap in the dielectric layer that separates the first and second conductive layers and increases the effective dielectric constant between the first and second conductive layers.

DETAILED DESCRIPTION

Figure 2:
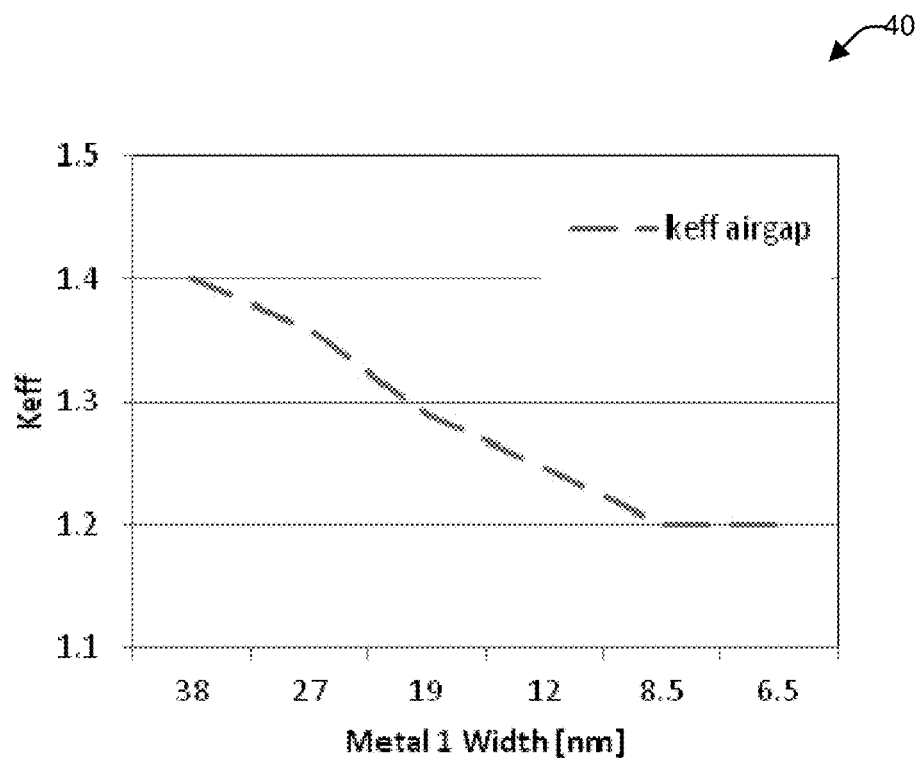
FIG. 2 illustrates a graph comparing metal line width versus dielectric constant results of the air gap of the present disclosure versus acceptable results of the international semiconductor technology roadmap for future technology nodes.
Figure 3:
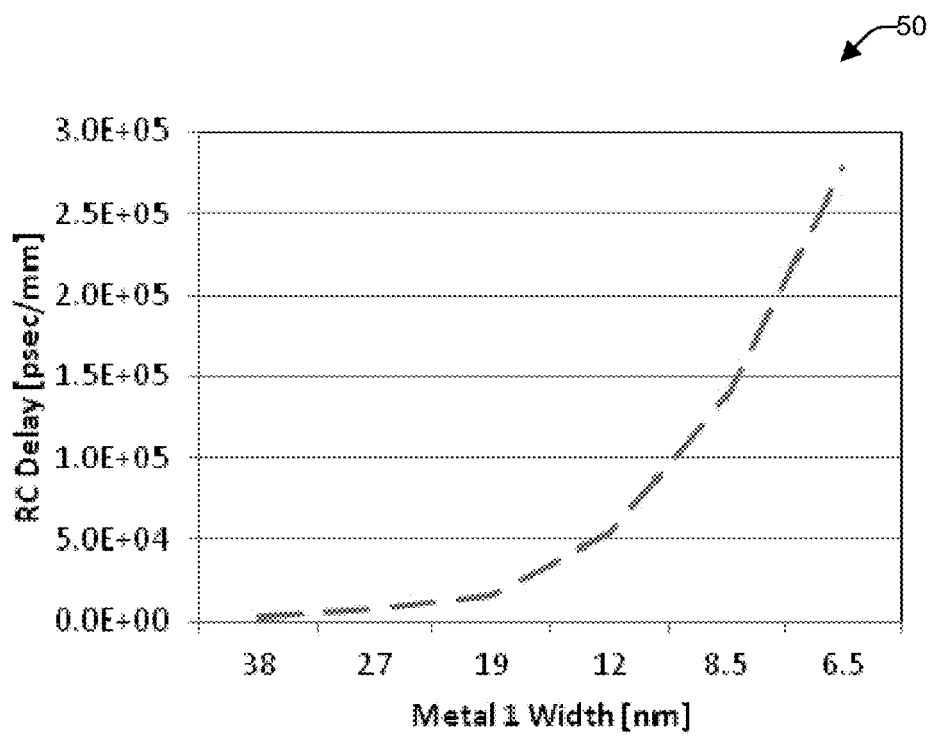
FIG. 3 illustrates a graph comparing metal line width versus RC time constant results of air gap of the present disclosure versus acceptable results of the international semiconductor technology roadmap for future technology nodes.

The present disclosure provides for a stacked conductive layer interconnect approach to lower the effective dielectric capacitance in between stacked metal line layers, reducing the capacitance and hence, the RC constant. This is accomplished through the replacement of at least portions of insulating layers, such as porous silicon carbide hydroxide (SiCOH) with air gaps. In one example, the present disclosure provides for a method of making a back end of line interconnect structure provided with air gap technology in between layers of the conductive line interconnect structure. In so doing, the effective permittivity is substantially reduced, enabling RC propagation delays exceeding the needs of the international semiconductor technology roadmap for future technology nodes. FIG. 2 illustrates a graph 40 comparing metal line width (nm) versus dielectric constant incorporating the air gap with the materials used in the International Technology Roadmap for Semiconductors—2011 Edition. FIG. 3 illustrates a graph 50 comparing metal line width (nm) versus RC delay (psec/nm) the air gap with the materials used in the International Technology Roadmap for Semiconductors—2011 Edition. This new structure lowers the effective dielectric constant for intermediate metal layers to 1.2. In turn this reduces the RC time constant by 40% to 50%. In addition, a method is shown to create the airgap structure with an efficient one-mask process.

Figure 1:
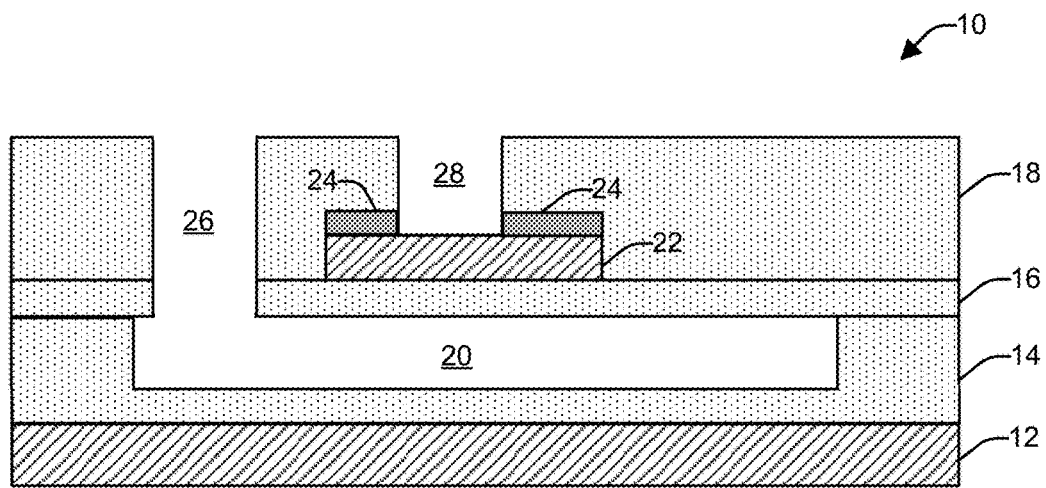
FIG. 1 illustrates a cross-sectional view of an example of a portion of an interconnect structure.

FIG. 1 illustrates a cross-sectional view of an example of a portion of an interconnect structure 10. The interconnect structure 10 includes a first dielectric layer 14 overlying a conductive layer 12. The conductive layer 12 could overly a substrate or one or more other conductive layers (not shown), for example, separated by dielectric layers and/or air gaps between conductive layers. A second dielectric layer 16 overlies the first dielectric layer 14 and includes an air gap 20 that separates the first conductive layer 12 from a second conductive layer 22. A portion of a second dielectric layer 16 overlies the air gap 18 and a portion of the second dielectric layer 16 overlies the first dielectric layer 14. A first via 26 is connected to the air gap 18 through a third dielectric layer 18 that overlies the second dielectric layer 16 and the second conductive layer 22. Although FIG. 1 illustrates that the second conductive layer 22 appears to run generally perpendicular to the first conductive layer 12, both the first and second conductive layers 12 and 22, respectively, could run parallel or perpendicular relative to one another separated by the air gap 20.

The first via 26 was utilized to remove a sacrificial layer (e.g., polysilicon) that was deposited and removed to form the air gap 20, as will be further discussed regarding formation of the interconnect structure, and air gap. A second via 28 extends to the second conductive layer 22 to provide a mechanism for connecting other layers and/or devices to the second conductive layer 22. The first and second vias 26 and 28 are formed in a single mask step. However, as can be seen from FIG. 1, the first via 26 extends much further than the second via 28, so a remaining portion of an etch stop layer 24 is illustrated overlying two opposite portions of the second conductive layer 22 that was utilized to protect the second conductive layer 22 from further etching during the formation of the second via 28 and the first via 26 down to the sacrificial layer (not shown).

Figure 4:
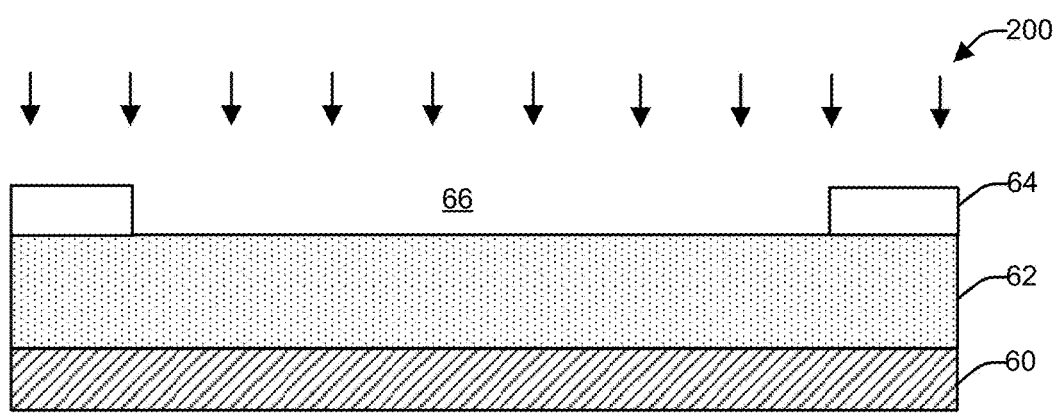
FIG. 4 illustrates a cross-sectional view of an interconnect structure in its early stages of fabrication, and undergoing an etch process to form a trench opening.

Turning now to FIGS. 4-15, an example fabrication is discussed in connection with formation of the example of an interconnect structure. FIG. 4 illustrates a cross-sectional view of an interconnect structure in its early stages of fabrication. The interconnect structure includes a first dielectric layer 62 deposited over a first conductive layer 60. The first conductive layer 60 can be formed of any of a variety of conductive materials, such as copper, gold, titanium, aluminum, molybdenum, platinum, silver, or a combination of these or other conductive materials. Any suitable technique for depositing the conductive layer 60 can be employed such as sputtering, electroplating, metal organic chemical vapor deposition (MOCVD), molecular beam epitaxy (MBE) or other suitable deposition techniques. The first dielectric layer 62 could be a dielectric layer that is selected to have a generally high dielectric constant, such as porous SiCOH. However, other dielectric layers with generally high dielectric constants could be employed.

A patterned photoresist material layer 64 is applied to cover the structure and is then patterned and developed to expose an open region 66 in the photoresist material layer 64 in accordance with an opening pattern. The photoresist material layer 64 can have a thickness that varies in correspondence with the wavelength of radiation used to pattern the photoresist material layer 64. FIG. 4 also illustrates performing an etch process 200 to remove portions of the first dielectric layer 62 to extend the opening and form a trench opening 68 (FIG. 5) in the first dielectric layer 62. The resultant structure is illustrated in FIG. 5.

Figure 5:
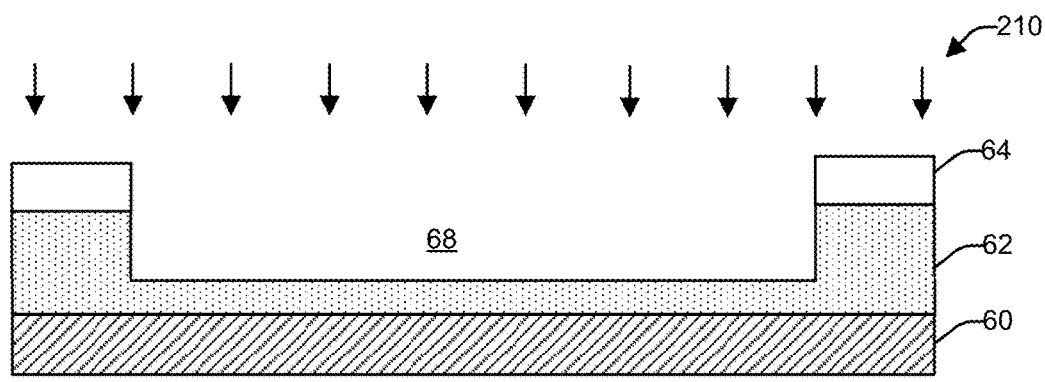
FIG. 5 illustrates the resultant structure of FIG. 4 undergoing a deposition process to deposit a sacrificial layer in the trench opening.
Figure 6:
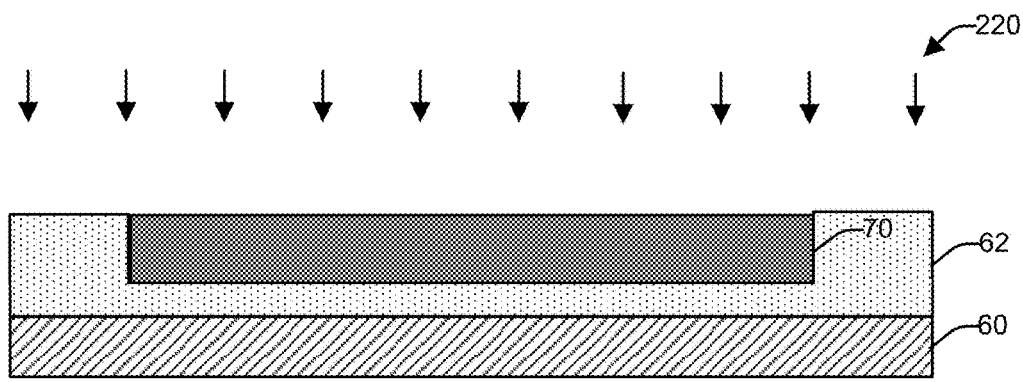
FIG. 6 illustrates the resultant structure of FIG. 5 after undergoing the deposition process to deposit the sacrificial layer in the trench opening.

FIG. 5 illustrates the resultant structure undergoing a deposition process 210 to deposit a sacrificial layer 70 (FIG. 6) in the trench opening 68. The sacrificial layer 70 is formed of a material that can be etched away by an etchant at a substantially faster rate than the dielectric material layers employed to form the interconnect structure. In one example, the sacrificial layer 70 is formed from polysilicon. This can be selectively removed employing a vapor phase etch of Xenon Fluoride ($XeF_2$). However, other sacrificial materials could be employed. The photoresist material layer 64 is then stripped. The sacrificial layer 70 can be polished via chemical mechanical polishing (CMP) flush with the top surface of the first dielectric layer 62 to provide the resultant structure of FIG. 6. FIG. 6 also illustrates the structure undergoing a deposition process 220 to deposit a second dielectric layer 72 over the sacrificial layer 70. The resultant structure is illustrated in FIG. 7.

Figure 7:
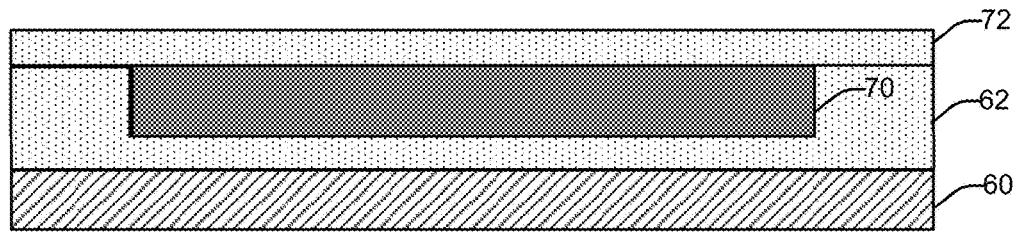
FIG. 7 illustrates the resultant structure of FIG. 6 after undergoing a deposition process to deposit a second dielectric layer over the sacrificial layer.
Figure 8:
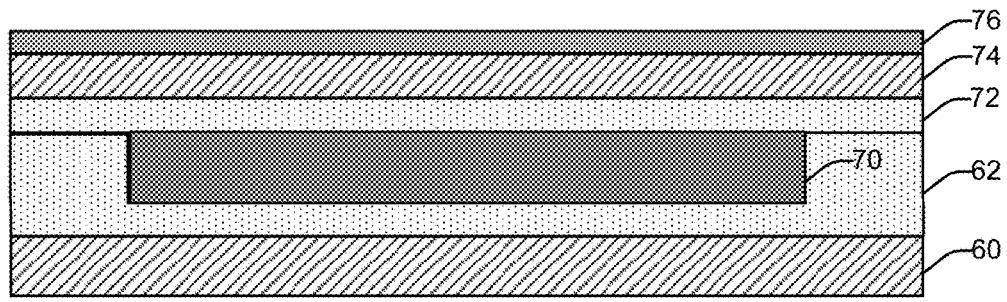
FIG. 8 illustrates the structure of FIG. 7 after undergoing deposition processes to deposit a second conductive layer over the second dielectric layer and an etch stop layer over the second conductive layer.

FIG. 8 illustrates the structure of FIG. 7 after undergoing the first deposition process 72 to deposit a second conductive layer 74 over the second dielectric layer 72, and a second deposition process to deposit an etch stop layer 76 over the second conductive layer 74. The second conductive layer 74 can be formed of any of a variety of conductive materials, such as copper, gold, titanium, molybdenum, platinum, silver, or a combination of these or other conductive materials. The etch stop layer 76 can be formed of a variety of materials, such as Titanium Nitride (TiN) or other types of etch stop materials.

Any suitable technique for depositing each layer can be employed such as metal organic chemical vapor deposition (MOCVD), molecular beam epitaxy (MBE), Low Pressure Chemical Vapor Deposition (LPCVD), Plasma Enhanced Chemical Vapor Deposition (PECVD), High Density Chemical Plasma Vapor Deposition (HDPCVD), Atomic Layer Deposition (ALD), physical vapor deposition or high density plasma chemical vapor deposition (HDPCVD) techniques, spin on techniques, or other suitable deposition techniques.

Figure 9:
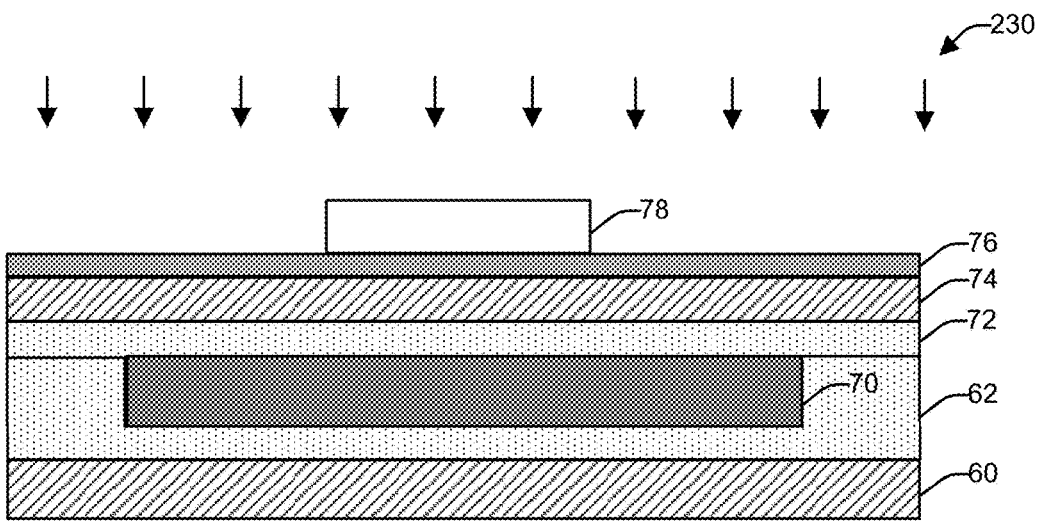
FIG. 9 illustrates the structure of FIG. 8 undergoing an etch process to remove portions of the second dielectric layer and the etch stop layer.

Next, as represented in FIG. 9, a photoresist material layer 78 is applied to cover the structure and is then patterned to protect regions where a second conductive portion 80 is to be formed from the second conductive layer 74. The second conductive portion 80 can be a conductive line, a traversing conductive layer or simply a modified layer or other conductive structure of the second conductive portion 80. The photoresist material layer 78 can have a thickness that varies in correspondence with the wavelength of radiation used to pattern the photoresist material layer 78. The photoresist material layer 78 may be formed over the substrate via spin-coating or spin casting deposition techniques, selectively irradiated and developed. FIG. 9 also illustrates performing of an etch process 230 on the etch stop layer 76 and the second conductive layer 74 to provide a portion of a conductive layer or a second conductive portion 80 and a portion of an etch stop layer or an etch stop 82 overlying the second conductive portion 80. The etch process 230 could be a single etch process or multiple etch process. The resultant structure is illustrated in FIG. 10.

Figure 10:
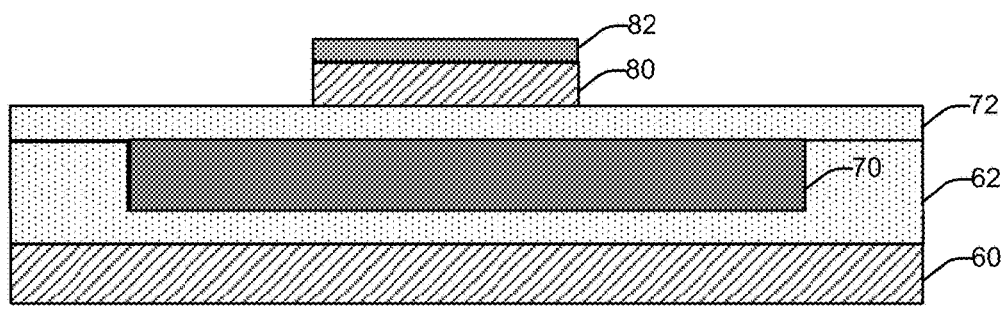
FIG. 10 illustrates the structure of FIG. 9 after undergoing the etch process of FIG. 9 to remove portions of the second dielectric layer and the etch stop layer.
Figure 11:
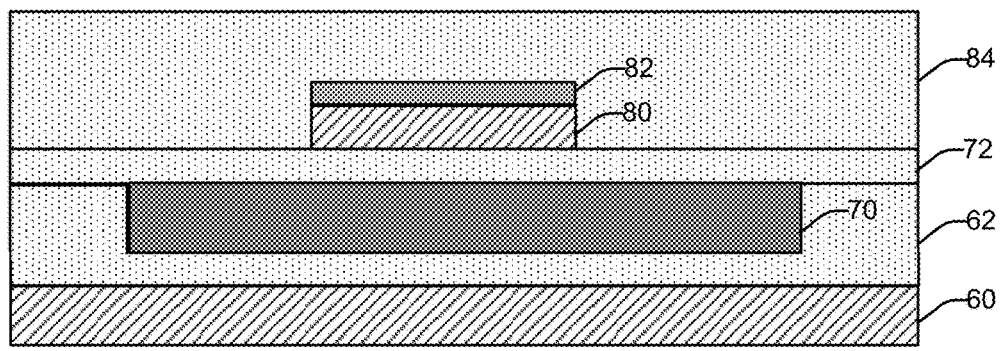
FIG. 11 illustrates the structure of FIG. 10 after deposition of a third dielectric layer over the structure of FIG. 10.
Figure 12:
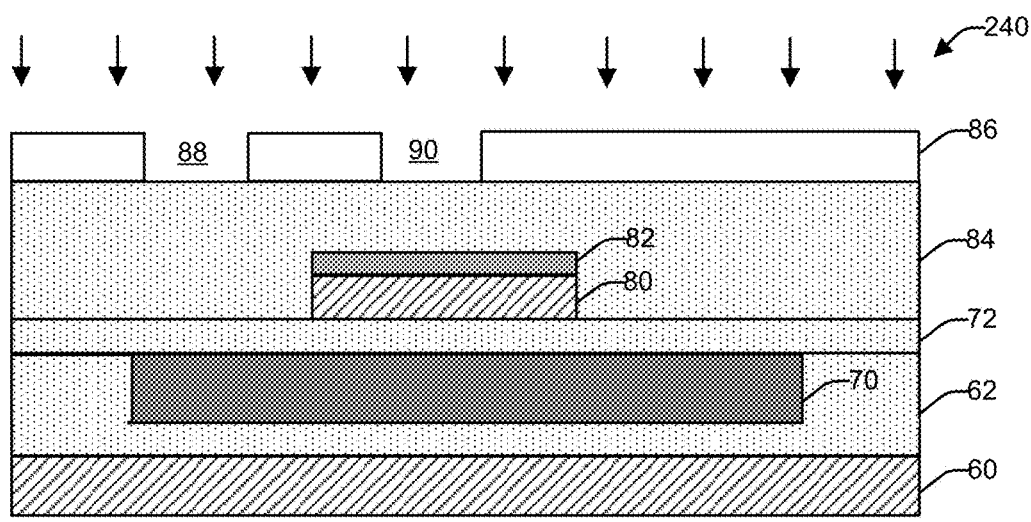
FIG. 12 illustrates the structure of FIG. 11 undergoing an etch process to form a first via and a second via.

FIG. 11 illustrates the structure of FIG. 10 after undergoing a deposition process to deposit a third dielectric layer 84 over the etch stop 82 and second conductive portion 80. Next, as represented in FIG. 12, a photoresist material layer 86 is applied to cover the structure and is then patterned to expose open regions 88 and 90 in the photoresist material layer 86. The photoresist material layer 86 can have a thickness that varies in correspondence with the wavelength of radiation used to pattern the photoresist material layer 86. The photoresist material layer 86 may be formed over the structure via spin-coating or spin casting deposition techniques, selectively irradiated and developed to form the openings 88 and 90.

FIG. 12 also illustrates performing of an etch process 240 (e.g., anisotropic reactive ion etching (RIE)) to form a first via 92 down to the sacrificial layer 70, and a second via 94 that stops on the etch stop layer 82. The etch process 240 can be a dry etch that employs an etchant which selectively etches the material of the second and third dielectric layers 72 and 84 at a faster rate than the underlying sacrificial layer 70, and the overlying etch mask formed from the photoresist material layer 86. The etch process 240 can also be an etch that employs and etchant that selectively etches the third dielectric layer 84 but stops on the etch stop 82 to protect the second conductive portion 80. For example, the structure may be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the etch mask to thereby form the first and second vias 92 and 94, respectively. The resultant structure is illustrated in FIG. 13.

Figure 13:
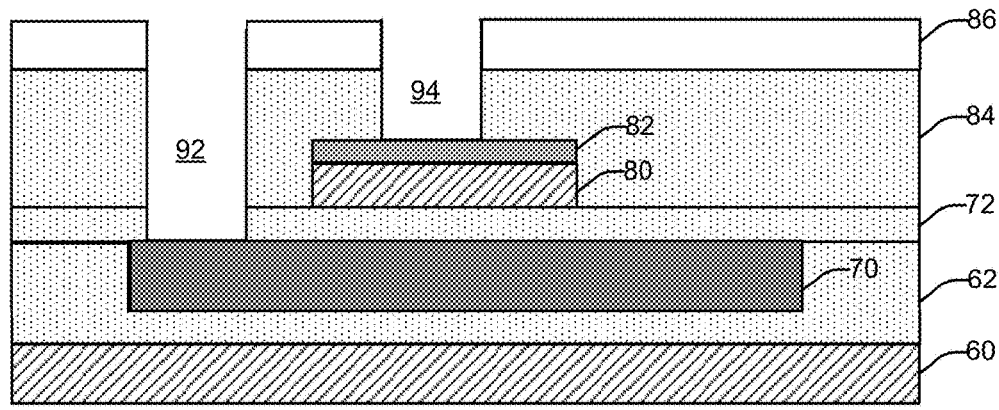
FIG. 13 illustrates the structure of FIG. 12 after undergoing the etch process to form a first via and a second via.
Figure 14:
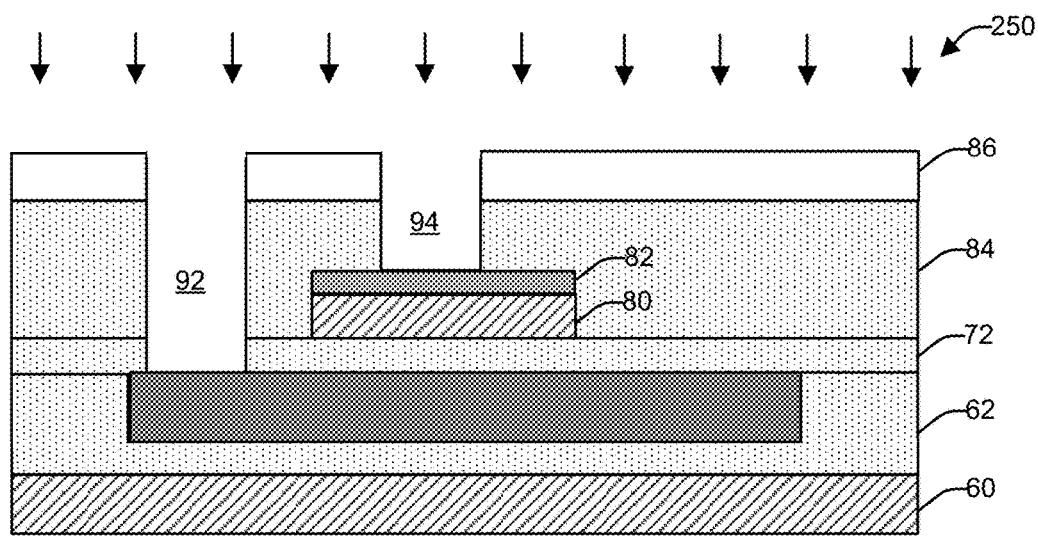
FIG. 14 illustrates the structure of FIG. 13 undergoing an etch process to remove the sacrificial layer.
Figure 15:
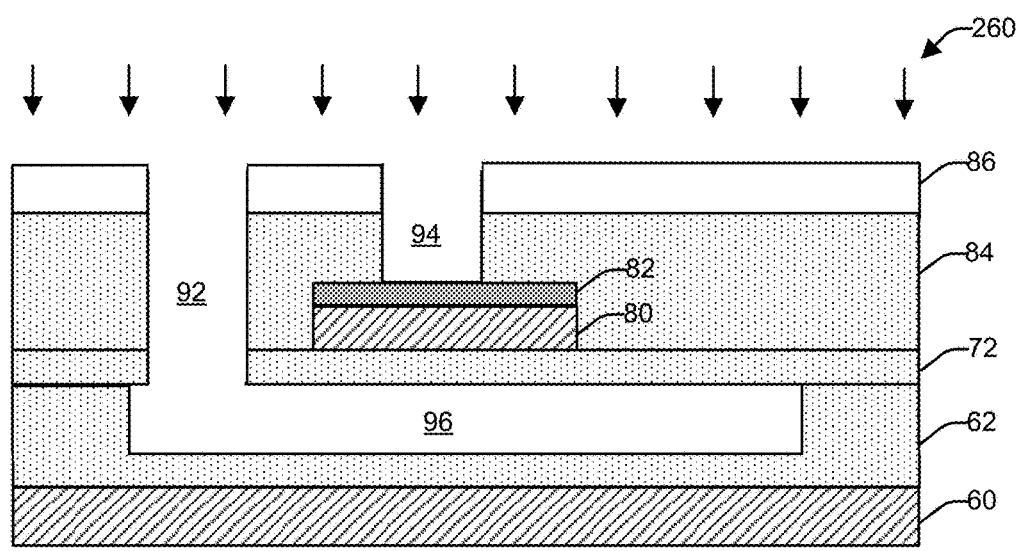
FIG. 15 illustrates the structure of FIG. 14 after undergoing an etch process to remove the sacrificial layer.

FIG. 14 illustrates the structure of FIG. 13 undergoing an etch process 250 on the sacrificial layer 70 to remove portions of the sacrificial layer 70 (FIG. 15) overlying the first dielectric layer 62, and underlying the second dielectric layer 72 to form an air gap 96 between the first conductive layer 60 and the second conductive portion 80 to increase the dielectric constant between the first conductive layer 60 and the second conductive portion 80. The etching process 250 can be a dry etch process. In one example, the dry etch is a vapor phase etch technique that employs a Xenon Fluoride ($XF_2$) gas. FIG. 15 also illustrates performing of an etch process 260 (e.g., anisotropic reactive ion etching (RIE)) to remove a portion of the etch stop 82 overlying the second conductive portion 80 in the second via 94, thereby exposing a top layer of the second conductive portion 80 to provide a mechanism for connecting other layers and/or devices to the second conductive portion 80. The photoresist material layer 86 is then stripped to leave a resultant structure that is similar to the structure shown in FIG. 1.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A stacked interconnect structure comprising:
   a first conductive layer;
   a second conductive layer;
   a first dielectric layer disposed between the first and second conductive layers and having an air gap in a portion of the first dielectric layer that separates the first and second conductive layers to decrease the effective dielectric constant between the first and second conductive layers;
   a second dielectric layer parallel to the first conductive layer;
   a third dielectric layer overlaying a portion of the second dielectric layer and contacting two opposing surfaces of the second conductive layer;
   an etch stop arranged between a portion of the second conductive layer and a portion of the third dielectric layer on a surface of the second conductive layer opposite the second dielectric layer;
   a first via that extends into the air gap of the first dielectric layer, wherein the second conductive layer is separated from the first via by a portion of the third dielectric layer that extends from a given surface of the third dielectric layer to the second dielectric layer; and
   a second via that extends from the given surface of the third dielectric layer to the second conductive layer.

2. The stacked interconnect structure of claim 1, wherein the first conductive layer comprises a conductive material comprising one of copper, gold, titanium, aluminum, molybdenum, platinum, and silver, or a combination of these conductive materials.

3. The stacked interconnect structure of claim 1, wherein the second conductive layer comprises one of a conductive line and a traversing conductive layer.

4. The stacked interconnect structure of claim 1, wherein the first dielectric layer is porous silicon carbide hydroxide (SiCOH).

5. The stacked interconnect structure of claim 1, wherein a portion of the second dielectric layer is arranged between the air gap and the second conductive layer.

6. The stacked interconnect structure of claim 1, wherein the first via extends through the second and third dielectric layers to the air gap.

7. The stacked interconnect structure of claim 1, wherein the second via extends through the etch stop to expose a portion of a surface of the second conductive layer opposite the second dielectric layer.

8. The stacked interconnect structure of claim 7, wherein the etch stop is titanium nitride (TiN).

9. A stacked interconnect structure comprising:
a first conductive layer;
a first dielectric layer overlying the first conductive layer;
a second dielectric layer, wherein the first and second dielectric layers are disposed between the first conductive layer and a second conductive layer, wherein an air gap is arranged in a portion of the first dielectric layer, the air gap defined by a boundary that includes a surface of the first dielectric layer opposite the first conductive layer and a surface of the second dielectric layer opposite the second conductive layer;
a third dielectric layer overlaying a portion of the second dielectric layer and contacting two opposing surfaces of the second conductive layer;
an etch stop arranged between the second conductive layer and the third dielectric layer on a surface of the second conductive layer opposite the second dielectric layer;
a first via that extends through the second and third dielectric layers to the air gap, the first via further defining the boundary of the air gap, wherein the second conductive layer is separated from the first via by a portion of the third dielectric layer that extends from a given surface of the third dielectric layer to the second dielectric layer; and
a second via that extends from the given surface of the third dielectric layer to the second conductive layer.

10. The stacked interconnect structure of claim 9, wherein the second via that extends through the third dielectric to the second conductive layer.

11. The stacked interconnect structure of claim 9, wherein the air gap separating the first and second conductive layers decreases the effective dielectric constant between the first and second conductive layers.

12. The stacked interconnect structure of claim 9, wherein the first dielectric layer is porous silicon carbide hydroxide (SiCOH).

13. The stacked interconnect structure of claim 12, wherein the second via extends through the portion of the etch stop to expose the surface of the second conductive layer opposite the second dielectric layer.

14. The stacked interconnect structure of claim 9, wherein the first conductive layer comprises one of copper, gold, titanium, aluminum, molybdenum, platinum, and silver, or a combination of these conductive materials.

* * * * *